United States Patent
Luellau et al.

(10) Patent No.: US 6,411,366 B2
(45) Date of Patent: *Jun. 25, 2002

(54) EXPOSURE DEVICE FOR PRINTING PLATES INCLUDING DIGITALLY CONTROLLED MICROMIRROR PICTURE-GENERATING UNIT AND METHOD OF TRIGGERING SAME

(75) Inventors: Friedrich Luellau, Hamburger Landstrasse 17a, D-21357 Bardowick; Claus Mayer, Scharnebeck, both of (DE)

(73) Assignee: Friedrich Luellau, Bardowick (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/308,433

(22) PCT Filed: Dec. 31, 1996

(86) PCT No.: PCT/EP96/05869

§ 371 (c)(1),
(2), (4) Date: May 19, 1999

(87) PCT Pub. No.: WO98/29782

PCT Pub. Date: Jul. 9, 1998

(51) Int. Cl.[7] .................. G03B 27/70; G03B 27/52; G03B 27/72
(52) U.S. Cl. ............... 355/65; 355/40; 355/71
(58) Field of Search .................. 355/65, 40, 32, 355/67, 71; 358/444, 450; 430/253; 382/217

(56) References Cited

U.S. PATENT DOCUMENTS 5,801,804 A * 9/1998 Matsumoto .............. 355/40
6,211,948 B1 * 4/2001 Luellau et al. ........... 355/71

FOREIGN PATENT DOCUMENTS

| DE | WO 95/22787 | * 7/1993 | ........ G03F/7/20 |
| EP | 0 549 993 | * 7/1993 | ........ B29C/67/00 |

* cited by examiner

*Primary Examiner*—Russell Adams
*Assistant Examiner*—Peter B. Kim
(74) *Attorney, Agent, or Firm*—Michael J. Striker

(57) ABSTRACT

The method for exposing a printing plate copies a stored model onto a printing plate. The exposure device includes at least one exposure head (1). Each exposure head (1) has a light source (3), a picture generating unit (8) and a copying optical element (9). The picture generating unit (8) includes electronically controllable micro mirrors arranged in a grid. The stored model is divided into partial images, which are shown in succession by the picture generating unit (8) and the copying optical element (9). Successive partial exposures of the printing plate are made by the at least one exposure head, which is accurately positioned at respective successive exposure positions by an electric linear drive so that individual copies of the partial images are combined into a total image on the printing plate with a position accuracy of better than 5 microns. Exposure times are shortened while maintaining copy quality.

18 Claims, 1 Drawing Sheet

EXPOSURE DEVICE FOR PRINTING PLATES INCLUDING DIGITALLY CONTROLLED MICROMIRROR PICTURE-GENERATING UNIT AND METHOD OF TRIGGERING SAME

BACKGROUND OF THE INVENTION

1. Field of the Invention

The invention relates to a method for triggering an exposure device for the photomechanical production of structured surfaces as a copy of an electronically memorized model, in particular for exposing printing plates, in which the exposure device includes at least one light source, one picture generating unit comprising movable, electronically individually triggerable micro mirrors arranged in a grid, and one copying optical element.

The invention also relates to an exposure device suitable for performing the method, having a movably embodied exposure head, which includes a light source, one picture generating unit comprising movable, electronically individually triggerable micro mirrors arranged in a grid, and one copying optical element.

2. Prior Art

Even today, up to 90% of offset printing plates are exposed via fill models with the aid of contact copy technology or in isolated cases with projection systems. This means that before an offset printing plate can be exposed to light, a film model is made. This is done with film exposers and film developing machines developed especially for this purpose.

The method step for preparing the film model disadvantageously increases the time and expense involved in putting images on offset printing plates.

From German Patent Disclosure DE 41 21 509 A1, a device suitable for exposing printing plates is known, which has an elongated light source in the form of a linear arc lamp, a collimator lens, an elongated light modulator comprising electronically triggerable movable micromirrors, and a copying optical element, all these elements being disposed in stationary fashion. The elongated linear form of the light source is used here to attain a higher light yield than in point-type light sources. Consequently, however, the stationary exposure arrangement can expose only a very narrow strip of a printing plate. To expose the complete printing plate, the plate is therefore displaced continuously relative to the stationary exposure arrangement. To assure that the copied data remains stationary relative to the exposed material, the transmission of the data within the mirror array must also be displaced in synchronism with the motion of the printing plate.

The known apparatus has the disadvantage that because of the continuous motion of the printing plate, it can expose only in strips and can therefore utilize only a narrow region of the micromirror array. This leads to excessively long total exposure times. Also, because of the limited length of the micromirror array, as a rule it is not possible to expose the entire length of the printing plate simultaneously. Instead, the printing plate must be exposed column by column and moved back and forth for the purpose. This in turn, however, requires that the entire heavy table on which the printing plate is spread out be displaced with accuracy in the micrometer range. Because of the mass to be moved, this cannot be done arbitrarily quickly with the requisite precision. The result is a further lengthening of the total exposure time.

From International Patent Disclosure WO 95/22787, an apparatus for photomechanically making structured surfaces, in particular for exposing printing plates, is known that has a movable exposure head with a light source, a picture generating unit, and a copying optical element. The movable exposure head is compact in design and relatively light in weight. As a result, it can be positioned with micrometer accuracy. The picture generating unit comprises a liquid crystal screen that is disposed between two polarizers. From this reference an exposure method is also known in which the electronically memorized models are broken down into partial images, and the partial images are shown in succession on the liquid crystal screen and copied onto the printing plate in such a way that they combine into a total copy of the model. To that end, the exposure head is moved with extreme precision from one exposure position to the next between each two partial exposures. For exposing the entire printing plate, however, a great number of partial images have to be exposed. This can result in a very long exposure time.

In principle, the exposure time can be shortened by using higher light intensities for the exposure. Given the necessarily narrow design of the exposure head, however, higher light intensities lead to a no longer tolerable heat burden, especially since for the requisite polarization of the light entering the liquid crystal screen, a polarization foil is used. Such polarization filters admit the portion of the incident light that has the "correct" direction of polarization, while the remainder with the "wrong" direction of polarization is absorbed. A considerable amount of heat is thus created in the polarization filter at high light intensities and this heat must be dissipated if destruction of the polarization filter is to be averted. In the liquid crystal screen itself and in the second polarization foil that follows as well, heat from absorbed light occurs.

Particularly in producing offset printing plates for newspaper printing, the sequential exposure in known methods and apparatuses leads to disadvantageous bottlenecks in terms of time.

SUMMARY OF THE INVENTION

It is an object of the present invention to provide an improved exposure device for printing plates of the above-described type, which produces exposure results of satisfactory quality with reduced total exposure times.

It is also an object of the present invention to provide an improved method for controlling an exposure device of the above-described type for exposing printing plates according to an electronically stored model, whereby exposure times may be reduced while still producing exposure results of satisfactory quality.

In a method of this generic type, this object is attained in that the model is broken down electronically into two-dimensional partial images; that the partial images are shown in succession, but each partial image is shown with its entire area at the same time, by means of the picture generating unit, and successive partial exposures of the surface to be structured are made, in that a exposure head, provided with the light source, the picture generating unit and the copying optical element, moves between each two partial exposures from one exposure position to the next and stops there for the exposure, so that the individual partial copies are combined again into a total copy of the electronically memorized model.

The invention adopts the known method, in conjunction with a precision-controlled movable exposure head, which is based on the production of flat partial images using a liquid crystal screen, to a stationary exposure arrangement that is based on linear picture generation by means of micromirrors. For that purpose, in a first step of the invention, the stationary exposure device is embodied as a movable exposure head, and in a second step of the invention the quasi-linear micromirror array is replaced by a genuinely two-dimensional array, and in a third step of the invention the electronic process control for the motion of the exposure head and the exposure of the partial images is transferred. In this respect, the teaching provided in the first paragraph of the background section of German Patent Disclosure DE 41 21 509 A1 actually leads one skilled in the art away from using two-dimensional light modulators. If conversely one skilled in the art takes as his point of departure the apparatus and the associated method known from WO 95/22787, then by simply adopting the stationary exposure arrangement with micromirrors known from DE 41 21 509 A1, he certainly does not arrive at the subject of the invention. Nor does simply replacing the liquid crystal screen with the linear micromirror array lead directly to the invention. That would require a genuinely flat-area, two-dimensional micromirror array, which furthermore must be triggered quite differently from the linear array. Furthermore, the micromirror array cannot simply be used to replace the liquid crystal screen, because it reflects the light and does not transmit it. In addition, an absorber for the unusable reflected light must be provided, while the polarizers are no longer needed.

It can happen that not all the partial images can actually contain picture information. According to the invention, only partial images that have picture contents are therefore transmitted to the surface to be exposed. Because of the reduced number of partial images, the total exposure time is reduced approximately in proportion to the total number of partial images without any picture content. The exposure head arrives at each position of a partial image, along a meandering path.

The total exposure time still required for the remainder of the partial images can be reduced still further if each partial image is assigned a first data set for its image content and the second data set for its position, and that only data sets belonging together with image content are used to generate a succession of control data sets for transfer to a numerical controller. As a result, the times required for changing position between two exposure sites between the individual exposure times can also be reduced.

The time for producing the offset printing plates can be reduced by a further distance reduction in that the quantity of the second data sets is sorted in such a way that the lowest possible sum of individual spacings between the positions of the partial images results, and the data sets are transferred in this order to the numerical controller. In this way, the total image is produced over the shortest possible travel distance.

High travel speeds of the exposure head are attained if at least one electric linear drive is used as the drive for generating a motion of the picture generating unit. The exposure times can directly follow these thus-shortened positioning times without any waiting time, since the effects of elasticity, play and friction and natural vibrations are largely avoided by means of the electric linear drive.

Since offset printing plates can have some waviness that is sometimes greater than 2 mm, and these uneven features are also unevenly distributed, an adequate depth resolution of the copy must be attained by means of suitably small selected apertures. The low light yield, however, lengthens the exposure times for the partial image. To shorten these exposure times, it is provided that before each copying of a partial image, a measurement of the spacing of the picture generating unit or of the exposure head from the surface to be exposed is made, and deviations from a previously input value are automatically corrected. In this way, with a surprisingly low depth resolution, even with wavy plates, a high copy quality can be attained at short exposure times. The correction can preferably be made by moving the entire exposure head. In this way, even offset printing plates of various thickness can be exposed. The focal length can also be corrected accordingly, although this can lead to copying errors.

A uniform copy quality over the entire surface area of the model is attained if for copying a light source is used whose light flux is measured, and deviations from a predetermined light flux are automatically corrected.

This correction can be done either if the correction is done by varying the exposure time or if the correction is done by varying an electrical supply to the light source.

Even the most demanding print models in terms of quality can be produced by this method if the picture generating unit is copied at a reduced size. The reduction in size makes resolutions of 2540 dpi, for instance, possible. However, then the model must also be broken up into a corresponding number of partial images that are exposed in succession and then combined into the total model. Because the number of individual exposures is thus increased, the total exposure time rises considerably.

If a positioning of the partial images is done with an accuracy of better than 5 $\mu$m, and in particular better than 2 $\mu$m, the individual partial images succeed one another without gaps.

The total exposure time of a model can be reduced by providing that by using a plurality of exposure heads, a plurality of partial images are simultaneously copied.

Collisions of different exposure heads are avoided by providing that a relative motion of a plurality of copies with respect to the pattern carrier is effected synchronously. The spacing of the partial images lined up with one another and copied simultaneously advantageously remains constant then. Since the likelihood that both exposure heads simultaneously lack any picture content drops, and an exposure position can at the same time be skipped, it is advantageous if within a predetermined limit region the exposure heads can move independently of one another.

Because a spacing between two simultaneously exposed copies is variable, models with different resolutions can be exposed using the same exposure device. The spacing between two simultaneous copies amounts to an integral multiple of the individual picture dimensions.

Greater uniformity of the transitions is attained if the partial images are copied overlapping one another. In the region of the overlaps from the edge of the pictures to the interior, the density is adapted to rise linearly, so that by the superposition, a distribution corresponding to the original image is obtained.

An exposure device that is especially suitable for performing the method of the invention is distinguished in that a measuring and regulating device for measuring and regulating the spacing of the picture generating unit or of the exposure head from the surface to be exposed is provided. Before each exposure, by means of the measuring device, the spacing from the surface to be exposed is ascertained. By way of example, known laser measuring devices are suitable as the measuring device. The spacing is determined by interferometric length measurement. However, the space measurement can also be done by known acoustical or optical measuring methods. By comparisons with a predetermined set-point value, a controlling variable is determined that then readjusts the spacing via a suitable final control element. By way of example, this can also be done by adjusting the focal length or by motor-driven adjustment of the height of the exposure head or parts thereof. Because of the regulation provided according to the invention, light sources can be used that sweep a wide angle in space, so that because of the high light yield, short exposure times are possible.

Especially high speeds of motion and accelerations are attained by providing that the printing plate together with a required heavy plate to which it is fastened is not moved and instead only the exposure head is moved. In this way, more than ten partial images per second can be positioned and exposed.

The entire model is copied with constant quality over the entire surface if a sensor for measuring the light flux and a regulating circuit for correcting deviations in the light flux from a set-point value are provided. As a result, even slow changes in the light yield cannot have any influence on the outcome of the work.

For example, changes that make themselves felt over a relatively long period of time can be corrected by providing that an adjusting device for varying an exposure time is provided in the regulating circuit. The sensor for measuring the light flux is preferably disposed in the vicinity of the surface to be exposed, so that the incident light flux is detected once and for all before the exposure of the partial images begins.

Transient changes, caused for instance by fluctuations in the voltage from the power grid, can be compensated for if an adjusting device for varying the light flux is provided in the regulating circuit. Here the light sensor is disposed preferably in the vicinity of the light source, or the supply voltage is measured directly. By means of known circuits, the supply voltage can thus be kept constant, for instance.

It is possible to avoid turning the lamp on and off frequently if a shutter or switching the light flux is provided. This lengthens the service life of the lamp.

If the picture generating unit itself is embodied such that it acts as an exposure shutter, then it is advantageously possible to dispense with a separately embodied exposure shutter.

An especially advantageous dynamic behavior of the overall device is obtained if the driver for generating the motion of the exposure head is embodied as a linear drive. Such drives have high positioning precision of better than 2 $\mu$m.

The entire model can be finished in an even shorter time is a plurality of exposure heads are disposed on one axis.

An especially favorable construction is obtained if each exposure head is assigned its own linear drive, and for the other axis a common linear drive for all the exposure heads is provided. In return, the locking speed in one axis is somewhat less than that of the two heads in the other direction. This affects the total exposure time only slightly. Because each exposure head has its own linear drive in the other direction, it is possible to switch briefly over to different resolutions, by moving the exposure heads in such a way as to create a larger or smaller interstice.

BRIEF DESCRIPTION OF THE DRAWING

The invention will be described in terms of a preferred embodiment in conjunction with the drawing, from which other advantageous details can be learned.

The sole drawing figure is a section through an exposure head of an exposure device according to the invention shown schematically.

DESCRIPTION OF THE PREFERRED EMBODIMENT

Figure 1:
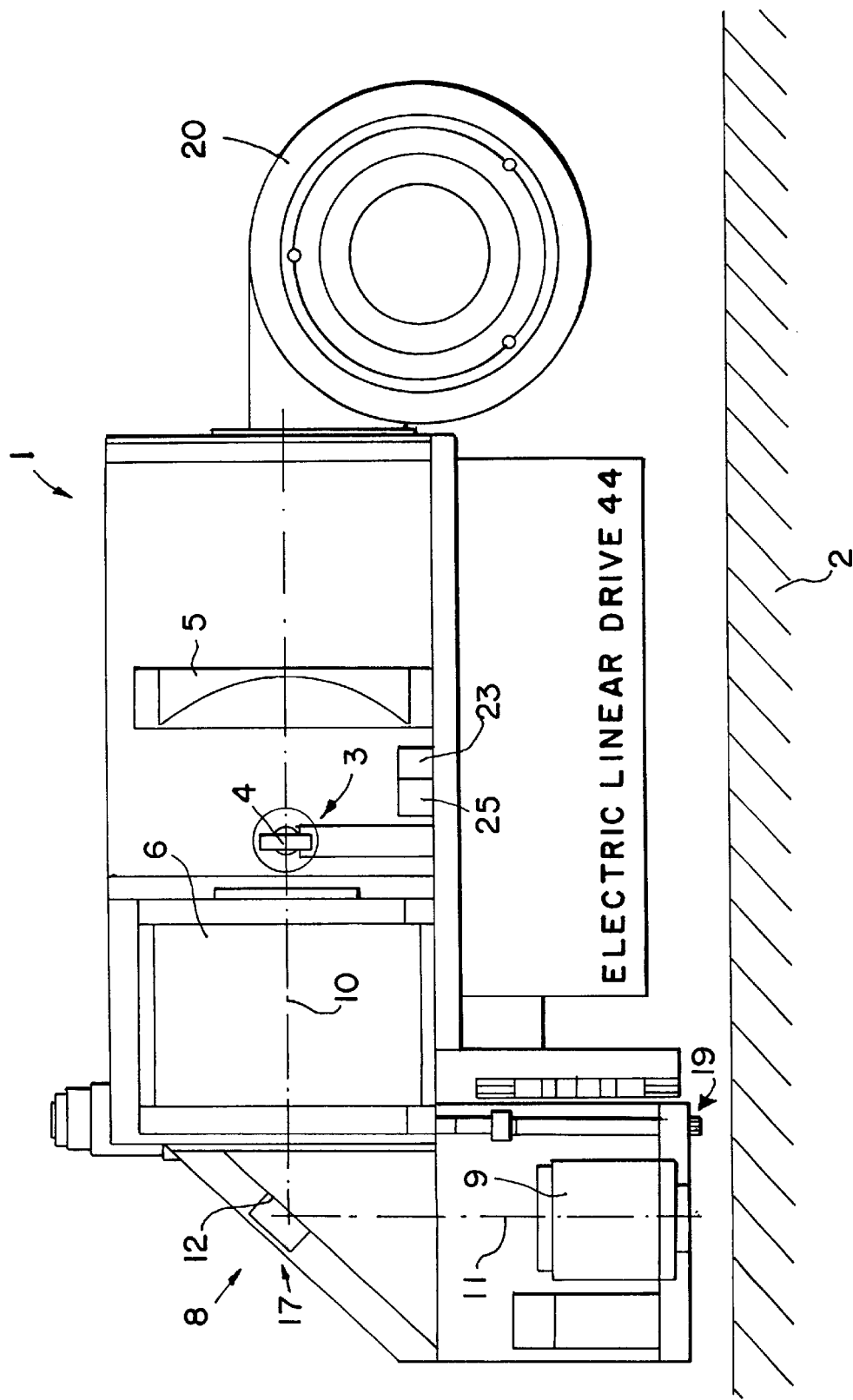

In the drawing, an exposure head 1 can be seen, which is disposed on a support 2 so that it can be moved by means of electric linear drive 14, which can comprise a motor. The exposure head 1 has a light source 3, which comprises a metal halide lamp 4, a reflector 5 and a collimator 6. The collimator 6 includes an optical lens element, not shown, which aligns the light, intended for the exposure, substantially parallel. The exposure head 1 also includes a picture generating unit 8 and a copying optical element 9, by means of both of which the picture model generated in the picture generating unit 8 can be projected onto a printing plate, not shown, on a reduced scale on the support 2 and copied.

For easier manipulability, the exposure head 1 is disposed substantially horizontally above the support 2. The light used for the exposure originally has a beam path with a horizontal optical axis 10. For copying on the support 2, an optical axis 11 of the copying optical element 9 is vertically oriented. For the deflection of the beam out of the horizontal to the vertical, a reflective surface 12 of the picture generating unit 8 is provided. Adequate heat dissipation is provided by a fan 20 mounted laterally on the housing of the exposure head 1.

A UV-permeable filter or a UV-permeable optical element could advantageously be disposed in the beam path downstream of the metal halide lamp 4; it extracts a substantial portion of the light intensity, in the non-usable spectral range, from the beam path and thus reduces the heat burden on the downstream optical elements.

The picture generating unit 8 comprises a microchip, which has electronically individually triggerable movable micromirrors disposed in a grid. The mirrors may be oriented by electronic triggering either in such a way that they deflect the beam path of the incident light out of the horizontal to the vertical and thus into the copying optical element 9, or such that the reflected light is deflected just past the side of the copying optical element 9. By individual alignment of the micromirrors in certain area regions, a picture model can be created which can be projected by the copying optical element 9 onto the printing plate. Nearly all the light not used for the copying is deflected out of the beam path in the process.

A model to be copied onto the printing plate or the support 2 is stored digitally in memory in a computer not shown in the drawing. By means of suitable programs, the model is broken down into partial images and carried in a known manner, via a control line, on to the micromirror array that here acts as the picture generating unit 8.

For the exposure, the light source 4 is briefly supplied with sufficient current for the requisite light quantity.

This mode of operation, using suitable flashbulbs, has the advantage of less power loss compared with continuous operation.

Alternatively, however, a shutter can also be provided that with a suitable control unit determines the exposure time. The picture generating means 8 can comprise a shutter device 17.

After the exposure of one partial image, the exposure head 1 is displaced relative to the support 2 by the grid amount corresponding to the portion of the partial image. The exposure of the next partial image is done in such a way that the partial images follow one another without gaps and add up in terms of their picture contents to form the total image.

In this way, it is possible for models produced with the aid of modern data processing systems to be copied directly onto a print medium. The costs for producing a film and the attendant time consumed are dispensed with.

The metal halide lamp 4 used as a light source 3 must be operated for a certain length of time until it reaches its full power. The light flux originating at the light source 3 can therefore be measured by a light sensor 23 and transmitted via a signal line to an electronic regulating means 25. Depending on the measured intensity of the light flux, the exposure time is specified, and a shutter is opened for the duration of the exposure time. After a first partial image has been exposed onto the printing plate, the exposure head 1 is displaced by one image division, and another partial image is then exposed.

From a spacing measurement, embodied for instance as a laser distance measuring device 19, the electronic triggering means learns the current spacing from the printing plate. In the event of deviations from a previously established set-point value, a corresponding control command for the function group for spacing regulation or focal length regulation is then generated, so that the spacing or focal length is then corrected accordingly to achieve the greatest possible sharpness of the copy.

Accordingly, the result of an exposure measurement is compared with a preestablished set-point value, and a suitable correction signal to a shutter regulator or light source regulator is generated. The instantaneous position of the exposure head can be transmitted by a measurement head.

We claim:

1. A method of triggering an exposure device to expose a printing plate according to an electronically stored model, said exposure device comprising an exposure head (1) including a light source (3), a picture generating unit (8), a copying optical element (9), an electric linear drive (14) for moving the picture generating unit (8) and a device (19) for automatically measuring and regulating a distance of the picture generating unit (8) from a surface of the printing plate and for automatically correcting deviations of said distance from a set value, wherein said electric linear drive has a positioning precision of better than 2 µm and said picture generating unit (8) comprises movable electronically individually triggerable micro mirrors arranged in a grid, said method comprising the steps of:

a) breaking down the electronically stored model electronically into two-dimensional partial images;
    b) moving said exposure head (1) with the coping optical element (9) and the picture generating unit (8) by means of the electric linear drive (14) between respective exposure positions and halting said exposure head (1) at each of said exposure positions to make successive corresponding partial exposures on the surface of said printing plate, so that individual copies of said partial images made at said exposure positions are combined into a total copy of the electronically stored model; and
    c) prior to making each of said partial exposures measuring the distance of the picture generating unit (8) from the surface of the printing plate and automatically correcting deviations from the set value by means of said device (19) for automatically measuring and regulating;
    whereby said copies of said partial images are positioned to an accuracy of better than 5 µm and exposure times are reduced while maintaining copy quality.

2. The method as defined in claim 1, wherein said accuracy is better than 2 µm.

3. The method as defined in claim 1, further comprising checking each of said partial images for the presence of picture information by means of an evaluation circuit or evaluation software and making said partial exposures as a function of the checking.

4. The method as defined in claim 1, further comprising assigning a first data set for image content and a second data set for position to each of said partial images and generating a succession of control data sets for transfer to a numerical controller only from said data sets containing said image content.

5. The method as defined in claim 4, further comprising sorting said second data sets so that a sum of corresponding individual distances between said respective partial exposures corresponding to said partial images is a lowest possible value and transferring said data sets to the numerical controller in a sorted order established by the sorting.

6. The method as defined in claim 1, further comprising measuring a light flux of said light source (3) with a light sensor (23) and controlling said light source (3) to correct deviations of said light flux from a predetermined set value according to the measuring.

7. The method as defined in claim 6, wherein the controlling of said light source includes controlling an electrical power supply connected electrically to the light source.

8. The method as defined in claim 1, wherein said copies of said partial images overlap each other.

9. A method of triggering an exposure device to expose a printing plate according to an electronically stored model, said exposure device including a plurality of exposure heads, each of said exposure heads including a light source (3), a picture generating unit (8), a copying optical element (9), an electric linear drive (14) for moving the picture generating unit (8) and a device (19) for automatically measuring and regulating a distance of the picture generating unit (8) from a surface of the printing plate and for automatically correcting deviations of said distance from a set value, wherein said electric linear drive has a positioning precision of better than 2 µm and wherein said picture generating unit (8) comprises movable electronically individually triggerable micro mirrors arranged in a grid, said method comprising the steps of:

a) breaking down the model electronically into two-dimensional partial images;
    b) moving said exposure heads (1) of said at least two of the picture generating units (8) simultaneously by means of the electric linear drives (14) associated with said at least two of the picture generating units (8) between respective exposure positions and halting said exposure heads at each of said exposure positions to make successive corresponding partial exposures on the surface of said printing plate, so that individual copies of at least two of the partial images made at said exposure positions are combined into a total copy of the electronically stored model; and
    c) prior to making each of said partial exposures measuring the distance of the picture generating unit (8) from the surface of the printing plate and automatically correcting deviations from a previously input set value by means of said device (19) for automatically measuring and regulating;
    whereby said individual copies of said partial images are positioned to an accuracy of better than 5 µm and exposure times are reduced while maintaining copy quality.

10. An exposure device for a printing plate, said exposure device comprising a plurality of movable exposure heads and means for positioning the exposure heads at successive exposure positions, wherein said means for positioning is an electric linear drive having a positioning precision of better than 2 μm and each of said exposure heads includes a light source (3) for generating light, a picture generating unit (8) for forming a partial image from said light generated by the light source (3) according to an electronically stored model, said picture generating unit (8) comprising movable, electronically individually triggerable micro mirrors arranged in a grid;

a copying optical element (9) for projecting the partial image onto a surface of a printing plate; and a measuring and regulating device (19) for measuring and regulating a spacing of the picture generating unit (8) from the surface (2) of the printing plate;

whereby individual copies of said partial images are positionable to an accuracy of better than 5 μm and exposure times are reducible while maintaining copy quality.

11. The device as defined in claim 10, wherein said exposure heads are arranged on one axis.

12. The device as defined in claim 11, wherein said means for moving said exposure heads comprises respective individual electric linear drives for corresponding ones of said exposure heads and a common linear positioning device for moving all of said exposure heads together along another axis.

13. An exposure device for printing plates, said exposure device comprising an exposure head (1) including a light source (3) for generating light, a picture generating unit (8) and an copying optical element (9), wherein said picture generating unit (8) comprises movable electronically individually triggerable micro mirrors arranged in a grid;

means for breaking down an electronically stored model electronically into two-dimensional partial images;

means for moving said exposure head (1) with the coping optical element (9) and the picture generating unit (8) between respective exposure positions and halting said exposure head (1) at each of said exposure positions to make successive corresponding partial exposures on a surface of said printing plate, so that individual copies of said partial images made at said exposure positions are combined into a total copy of the electronically stored model, said means for moving said exposure head (1) comprising an electric linear drive (14) having a positioning precision of better than 2 μm; and means (19) for measuring a distance of the picture generating unit (8) from the surface of the printing plate at each of said exposure positions prior to making each of said partial exposures and for automatically correcting deviations from a previously input set value;

whereby said copies of said partial images are positionable to an accuracy of better than 5 μm and exposure times are reducible while maintaining copy quality.

14. The device as defined in claim 13, further comprising a light sensor (23) for measuring light flux and a regulating circuit (25) for correcting deviations of said light flux from a set value according to signals from said light sensor (23).

15. The device as defined in claim 14, wherein the regulating circuit includes an exposure time adjusting device.

16. The device as defined in claim 15, wherein the regulating circuit includes a light flux adjusting device.

17. The device as defined in claim 14, further comprising a shutter or switch for the light flux (23).

18. The device as defined in claim 13, wherein the picture generating unit (8) comprises an exposure shutter (17).

* * * * *